(12) United States Patent
Son et al.

(10) Patent No.: US 9,859,009 B2
(45) Date of Patent: Jan. 2, 2018

(54) SEMICONDUCTOR MEMORY DEVICE FOR SWITCHING HIGH VOLTAGE WITHOUT POTENTIAL DROP

(71) Applicant: SK hynix Inc., Icheon-si, Gyeonggi-do (KR)

(72) Inventors: Yeong Joon Son, Icheon-si (KR); Jin Su Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/630,018

(22) Filed: Jun. 22, 2017

(65) Prior Publication Data

US 2017/0287563 A1   Oct. 5, 2017

Related U.S. Application Data

(62) Division of application No. 15/054,467, filed on Feb. 26, 2016, now Pat. No. 9,721,667.

(30) Foreign Application Priority Data

Sep. 18, 2015  (KR) .................. 10-2015-0132419

(51) Int. Cl.
| | |
|---|---|
| *G11C 16/04* | (2006.01) |
| *G11C 16/12* | (2006.01) |
| *H03K 17/687* | (2006.01) |
| *H03K 17/10* | (2006.01) |
| *G11C 16/24* | (2006.01) |
| *G11C 16/08* | (2006.01) |
| *G11C 16/30* | (2006.01) |
| *G11C 5/14* | (2006.01) |

(52) U.S. Cl.
CPC .............. *G11C 16/12* (2013.01); *G11C 5/145* (2013.01); *G11C 16/0466* (2013.01); *G11C 16/08* (2013.01); *G11C 16/24* (2013.01); *H03K 17/102* (2013.01); *H03K 17/6871* (2013.01); *G11C 5/147* (2013.01); *G11C 16/30* (2013.01)

(58) Field of Classification Search
CPC ......... G11C 16/12; G11C 16/08; G11C 5/145; G11C 16/24; G11C 16/0466; G11C 5/147; G11C 16/30; H03K 17/6871; H03K 17/102
USPC ............. 365/185.23, 230.06, 189.09, 185.11
See application file for complete search history.

(56) References Cited

U.S. PATENT DOCUMENTS

| | | | |
|---|---|---|---|
| 7,733,710 B2 | 6/2010 | Ha et al. | |
| 7,821,832 B2 | 10/2010 | Hahn | |

(Continued)

FOREIGN PATENT DOCUMENTS

| | | |
|---|---|---|
| KR | 1020110078759 A | 7/2011 |
| KR | 1020120066936 A | 6/2012 |

*Primary Examiner* — David Lam
(74) *Attorney, Agent, or Firm* — William Park & Associates Ltd.

(57) ABSTRACT

There are provided a high voltage switch circuit and a semiconductor memory device including the same. A high voltage switch circuit may include a switching circuit including a first depletion transistor and a first high voltage transistor, which are coupled in series between an input terminal and an output terminal, and a control signal generator for applying, to the first depletion transistor, a control signal having the same potential level as an input voltage applied to the input terminal, in response to a first enable signal and a second enable signal.

6 Claims, 8 Drawing Sheets

(56) References Cited

U.S. PATENT DOCUMENTS

| | | | |
|---|---|---|---|
| 7,961,523 B2* | 6/2011 | Lee | G11C 16/0483 |
| | | | 365/185.11 |
| 8,854,913 B2 | 10/2014 | Jang | |
| 9,349,457 B2 | 5/2016 | Kim et al. | |
| 2009/0085646 A1 | 4/2009 | Ha et al. | |
| 2015/0138893 A1* | 5/2015 | Kim | G11C 16/08 |
| | | | 365/185.23 |

* cited by examiner

SEMICONDUCTOR MEMORY DEVICE FOR SWITCHING HIGH VOLTAGE WITHOUT POTENTIAL DROP

CROSS-REFERENCE TO RELATED APPLICATION

The present application is a divisional application of U.S. application Ser. No. 15/054,467, filed on Feb. 26, 2016, and claims priority to Korean patent application number 10-2015-0132419 filed on Sep. 18, 2015, in the Korean Intellectual Property Office, the entire disclosure of which is incorporated by reference herein.

BACKGROUND

1. Technical Field

Embodiments of the present disclosure generally relate to an electronic device, and more particularly, to a high voltage switch circuit and a semiconductor memory device including the same.

2. Related Art

Semiconductor devices, particularly, semiconductor memory devices are generally classified into volatile memory devices and nonvolatile memory devices.

A non-volatile memory device performs a read/write operation at a relatively low speed, but retains stored data even when a power supply is cut off. Accordingly, the non-volatile memory device is used to store data to be retained regardless of a power supply. Examples of the non-volatile memory device are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories may be classified into NOR type flash memories and NAND type flash memories.

The flash memories advantageously implement RAM in which data is freely programmed and erased, and also advantageously implement ROM in which stored data is retained even when a power supply is cut off. The flash memories are widely used as a storage medium of portable electronic devices such as a digital camera, a personal digital assistant (PDA), and an MP3 player.

DETAILED DESCRIPTION

Figure 1:
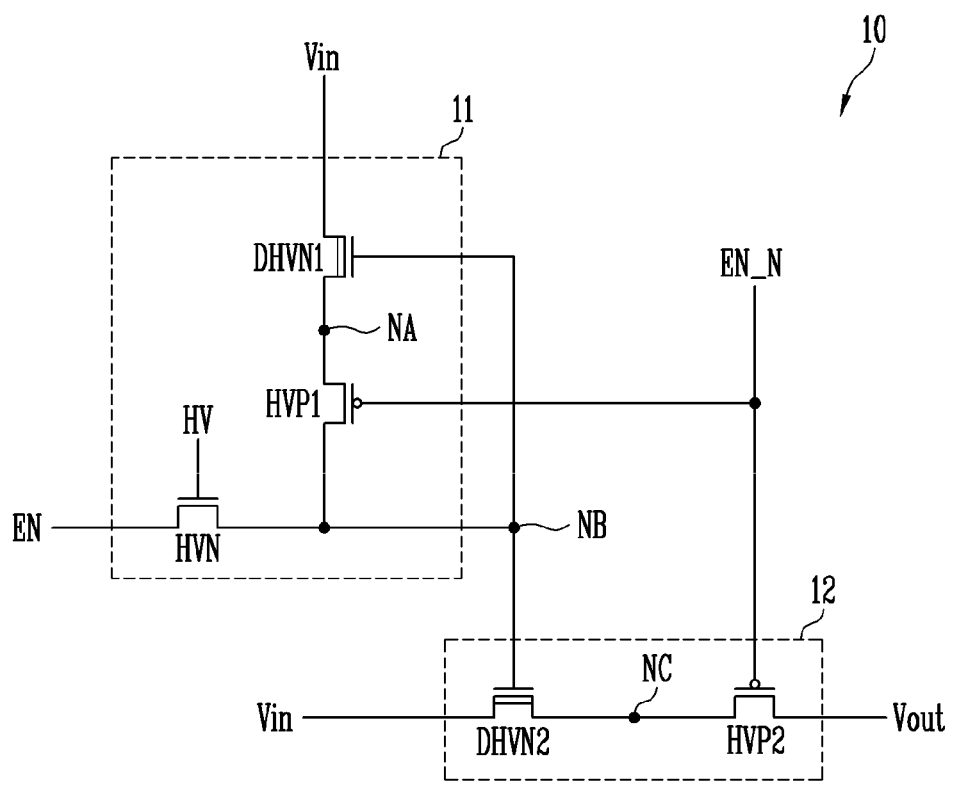
FIG. 1 is a circuit diagram illustrating a representation of an example of a high voltage switch circuit according to an embodiment of the present disclosure.

Embodiments may provide a high voltage switch circuit and a semiconductor memory device including the same, which may switch a high voltage without any potential drop.

According to an aspect of the present disclosure, there is provided a high voltage switch circuit. The high voltage switch circuit may include a switching circuit configured to include a first depletion transistor and a first high voltage transistor, which are coupled in series between an input terminal and an output terminal. The high voltage switch circuit may include a control signal generator configured to apply, to the first depletion transistor, a control signal having the same potential level as an input voltage applied to the input terminal, in response to a first enable signal and a second enable signal.

According to an aspect of the present disclosure, there is provided a semiconductor memory device. The semiconductor memory device may include a memory cell array configured to include a plurality of memory cells. The semiconductor memory device may include a pass circuit configured to perform switching on a word line of the memory cell array and a local word line in response to first and second select signals. The semiconductor memory device may include a block switch configured to generate the first and second select signals in response to an address signal, wherein the pass circuit may include a first depletion-type transistor and a first high voltage transistor, which may be coupled in series between the word line and the local word line.

According to an aspect of the present disclosure, there is provided a semiconductor memory device. The semiconductor memory device may include a memory cell array configured to include a plurality of memory cells. The semiconductor memory device may include a voltage provider configured to generate a plurality of pump voltages and a plurality of operation voltages. The semiconductor memory device may include a high voltage switch configured to output an output voltage by switching the plurality of pumping voltages. The semiconductor memory device may include a block switch configured to output a block select signal by using the output voltage in response to an address signal. The semiconductor memory device may include a pass circuit configured to transmit the plurality of operation voltages to the memory cell array in response to the block select signal, wherein the high voltage switch may output the output voltage with the same potential level or substantially the same potential level as the plurality of pump voltages.

In the following detailed description, only certain examples of embodiments of the present disclosure have been illustrated and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a circuit diagram illustrating a representation of an example of a high voltage switch circuit according to an embodiment of the present disclosure.

Referring to FIG. 1, the high voltage switch circuit 10 includes a control signal generator 11 and a switching circuit 12.

The control signal generator 11 includes a high voltage NMOS transistor HVN, a depletion transistor DHVN1, and a high voltage PMOS transistor HVP1.

The high voltage NMOS transistor HVN is turned on in response to a high voltage signal HV, and transmits a first enable signal EN to a node NB. The high voltage signal HV may be an internal signal having 3V (3 volts) to 5V (5 volts) or substantially 3V to 5V.

The depletion transistor DHVN1 and the high voltage PMOS transistor HVP1 are coupled in series between the node NB and a terminal to which an input voltage Vin to be transmitted is applied. A gate of the depletion transistor DHVN1 is coupled to the node NB. A second enable signal EN_N in a reverse relationship with the first enable signal EN is applied to a gate of the high voltage PMOS transistor HVP1.

When the first enable signal EN is applied as a logic high level and the second enable signal EN_N is applied as a logic low level (0V), the high voltage NMOS transistor HVN is turned on in response to the high voltage signal HV. Thus, the first enable signal EN is transmitted to the node NB, so that the potential level of the node NB is increased. The depletion transistor DHVN1 is turned on in response to a potential of the node NB. Thus, the input voltage Vin is supplied to a node NA between the depletion transistor DHVN1 and the high voltage PMOS transistor HVP1. The high voltage PMOS transistor HVP1 is turned on in response to the second enable signal EN_N of the logic low level. Thus, the input voltage Vin is supplied to the nod NB, so that the potential level of the node NB is increased by the potential level of the input voltage Vin. In this state, the depletion transistor DHVN1 has a negative threshold voltage, and thus the input voltage Vin is supplied to the node NB without any potential drop.

The switching circuit 12 includes a depletion transistor DHVN2 and a high voltage PMOS transistor HVP2. The depletion transistor DHVN2 and the high voltage PMOS transistor HVP2 is coupled in series between an output terminal Vout and an input terminal to which an input voltage Vin to be transmitted is applied. A gate of the depletion transistor DHVN2 is coupled to the node NB of the control signal generator 11. The second enable signal EN_N is applied to a gate of the high voltage PMOS transistor HVP2.

When the potential level of the node NB is increased up to the level of the input voltage Vin, the depletion transistor DHVN2 has a negative threshold voltage. Thus, when the input voltage Vin is transmitted to a node NC between the depletion transistor DHVN2 and the high voltage PMOS transistor HVP2, any potential drop does not occur. The high voltage PMOS transistor HVP2 outputs, as an output voltage Vout, the input voltage Vin transmitted to the node NC, in response to the second enable signal EN_N.

An operation of the high voltage switch circuit 10 according to an embodiment of the present disclosure will be described by dividing the operation into a turn-on operation and a turn-off operation.

1) Turn-on Operation (Operation of Transmitting Input Voltage)

In the turn-on operation, the first enable signal EN is applied as the logic high level and the second enable signal EN_N is applied as the logic low level (0V). In this state, the high voltage signal HV is applied as 3 to 5V.

The high voltage NMOS transistor HVN is turned on in response to the high voltage signal HV. Thus, the first enable signal EN is transmitted to the node NB, so that the potential level of the node NB is increased. In this case, the potential level of the node NB is increased by a value obtained by subtracting a threshold voltage value of the high voltage NMOS transistor HVN from the potential level of the first enable signal EN.

The depletion transistor DHVN1 is turned on in response of the potential of the node NB. Thus, the input voltage Vin is supplied to the node NA between the depletion transistor DHVN1 and the high voltage PMOS transistor HVP1. In this case, the voltage supplied to the node NA has a value obtained by subtracting a threshold voltage value of the depletion transistor DHVN1 from the potential level of the node NB. Here, the threshold voltage value of the depletion transistor DHVN1 has a negative threshold voltage value, and thus the potential level of the node NA is increased higher than the potential level of the node NB.

The high voltage PMOS transistor HVP1 is turned on in response to the second enable signal EN_N of the logic low level. Therefore, the voltage supplied to the node NA is supplied to the node NB, so that the potential level of the node NB is increased. Accordingly, the voltage supplied through the depletion transistor DHVN1 is gradually increased, and as a result, the node NB is increased by the potential level of the input voltage Vin.

Thus, the input voltage Vin is supplied to the node NB without any potential drop.

Since the potential level of the node NB is increased by the input voltage Vin, the depletion transistor DHVN2 of the switching circuit 12 transmits the input voltage Vin to the node NC without any potential drop. The PMOS transistor HVP2 outputs the input voltage Vin transmitted to the node NC as an output voltage in response to the second enable signal EN_N.

Thus, the high voltage switch circuit 10 according to an embodiment of the present disclosure can transmit the input voltage Vin as the output voltage Vout without any voltage drop.

2) Turn-Off Operation (Operation of Blocking Application of Input Voltage)

In the turn-off operation, the first enable signal EN is applied as the logic low level (0V) and the second enable signal EN_N is applied as the logic high level. In this state, the high voltage signal HV is applied as 3 to 5V.

The high voltage NMOS transistor HVN is turned on in response to the high voltage signal HV, so that the first enable signal EN is transmitted to the node NB. Thus, the potential level of the node NB becomes the logic low level (0V).

The depletion transistor DHVN1 is not completely turned off in response to the potential of the node NB. However, the high voltage PMOS transistor HVP1 is turned off in response to the second enable signal EN_N of the logic high level. Thus, the potential level of the node NB maintains 0V.

The depletion transistor DHVN2 of the switching circuit 12 is not completely turned off in response to the potential level (0V) of the node NB. However, the PMOS transistor HVP2 is turned off in response to the second enable signal EN_N to block the input voltage Vin from being output as the output voltage Vout.

According to the embodiment of the present disclosure, the high voltage switch circuit can transmit an input voltage without any potential drop in an operation of transmitting a high voltage. Thus, a pump circuit for generating a higher potential level than the input voltage is unnecessary to transmit the input voltage. Accordingly, it is possible to improve the degree of integration of a semiconductor memory device and improve current consumption.

Figure 2:
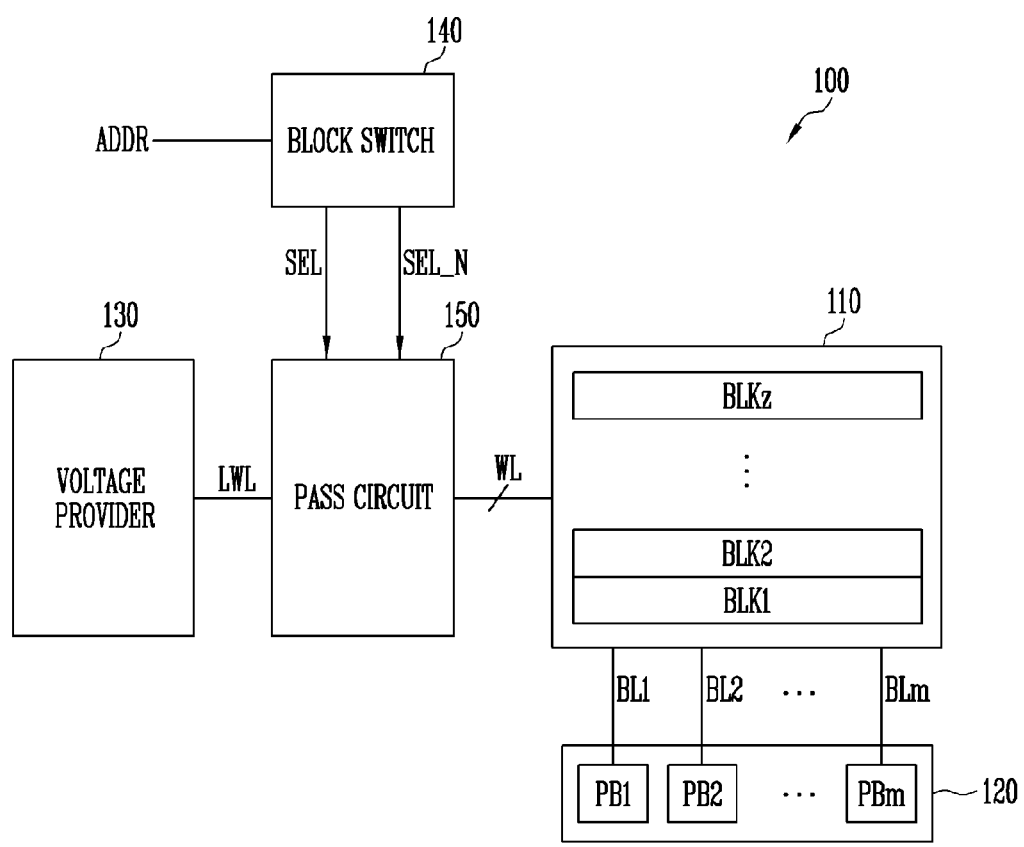
FIG. 2 is a block diagram illustrating a representation of an example of a semiconductor memory device according to an embodiment of the present disclosure.

FIG. 2 is a block diagram illustrating a representation of an example of a semiconductor memory device according to an embodiment of the present disclosure.

Referring to FIG. 2, the semiconductor memory device 100 includes a memory cell array 110, a read/write circuit 120, a voltage provider 130, a block switch 140, and a pass circuit 150.

The memory cell array 110 includes a plurality of memory blocks BLK1 to BLKz. The plurality of memory blocks BLK1 to BLKz are coupled to the pass circuit 150 through word lines WL. The plurality of memory blocks BLK1 to BLKz are coupled to the read/write circuit 120 through bit lines BL1 to BLm. The bit lines BL1 to BLm may be divided into an even bit line group and an odd bit line group. Each of the plurality of memory blocks BLK1 to BLKz includes a plurality of memory cells. As an embodiment, the plurality of memory cells may be nonvolatile memory cells. More particularly, the plurality of memory cells may be charge trap device-based nonvolatile memory cells. In the plurality of memory cells, memory cells coupled to the same word line are defined as one page. That is, the memory cell array 110 is configured with a plurality of pages. In addition, each of the plurality of memory blocks BLK1 to BLKz in the memory cell array 110 includes a plurality of cell strings. Each of the plurality of cell strings includes a drain select transistor, a plurality of memory cells, and a source select transistor, which are coupled in series between a bit line and a source line.

The read/write circuit 120 includes a plurality of page buffers PB1 to PBm. The plurality of page buffers PB1 to PBm are coupled to the memory cell array 110 through the bit lines BL1 to BLm. In a program operation, the plurality of page buffers PB1 to PBm temporarily store program data and then control potential levels of the bit lines BL1 to BLm according to the temporarily stored data. In a read operation, the plurality of page buffers PB1 to PBm read data stored in the memory cells by sensing potential levels or currents of the bit lines BL1 to BLm.

The voltage provider 130 generates a plurality of operation voltages to be provided to the memory cell array 110 and outputs the generated operation voltages to local word lines LWL. For example, the voltage generation unit 130 generates a program voltage and a pass voltage in the program operation, and generates a read voltage and a pass voltage in the read operation. Then, the voltage generation unit 130 outputs the generated voltages to the local word lines LWL.

The block switch 140 outputs a select signal pair SEL and SEL_N in response to an address signal ADDR. The select signal pair SEL and SEL_N may be output as a plurality of select signal pairs to respectively correspond to the plurality of memory blocks BLK1 to BLKz included in the memory cell array 110.

The pass circuit 150 is coupled between the local word lines LWL and the word lines WL of the memory cell array 110. The pass circuit 150 couples the local word lines LWL and the word lines WL to each other in response to the select signal pair SEL (i.e., first select signal) and SEL_N (i.e., second select signal), so that the operation voltages generated by the voltage provider 130 are applied to the word lines WL without any potential drop.

Figure 3:
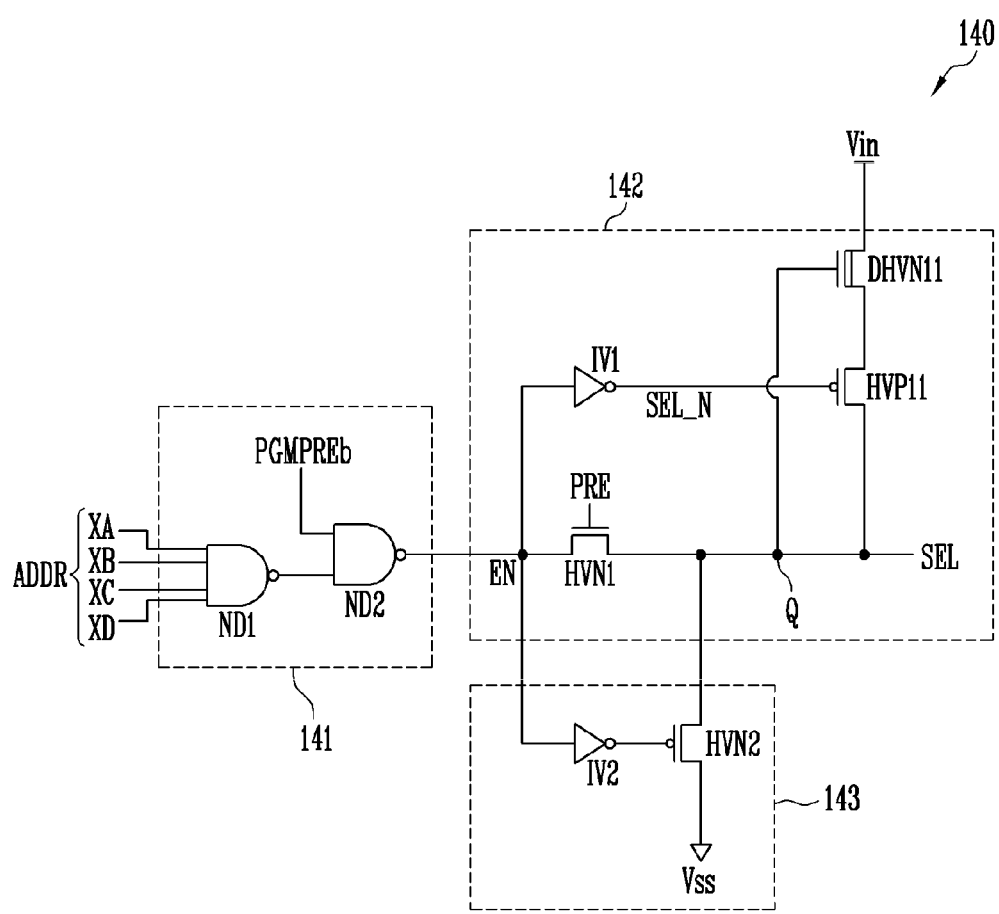
FIG. 3 is a representation of an example of a circuit diagram of a block switch of FIG. 2.

FIG. 3 is a representation of an example of a circuit diagram of the block switch of FIG. 2.

In an embodiment of the present disclosure, the block switch outputting one select signal pair is illustrated for convenience of illustration. However, a plurality of select signal pairs may be generated by disposing a plurality of block switches having the same structure.

Referring to FIG. 3, the block switch 140 includes a decoder circuit 141, a control signal generation circuit 142, and a discharge circuit 143.

The decoder circuit 141 outputs an enable signal EN in response to a plurality of decoded address signals ADDR (XA, XB, XC, and XD). The decoder circuit 141 includes may include logic gates, for example but not limited to, NAND gates ND1 and ND2. The NAND gate ND1 outputs an output signal by performing a logical combination on the plurality of decoded address signals XA, XB, XC, and XD. The NAND gate ND2 outputs the enable signal EN in response to the output signal of the NAND gate ND1 and a program precharge signal RGMPREb. For example, when the plurality of decoded address signals XA, XB, XC, and XD correspond to a memory block corresponding to the block switch, the enable signal EN is output as a logic high level.

The control signal generation circuit 142 may be configured similarly to the control signal generator 11 illustrated in FIG. 1. The control signal generation circuit 142 includes a high voltage NMOS transistor HVN1, a depletion transistor DHVN11, a high voltage PMOS transistor HVP11, and an inverter IV1.

The high voltage transistor HVN1 is turned on in response to a precharge signal PRE, and transmits the enable signal EN to an output node Q. The precharge signal PRE may be an internal signal having 3 to 5V.

The depletion transistor DHVN11 and the high voltage PMOS transistor HVP11 are coupled in series between the output node Q and a terminal to which an input voltage Vin to be transmitted is applied. Here, the input voltage Vin is an operation voltage generated by the voltage provider 130. A gate of the depletion transistor DHVN11 is coupled to the output node Q. The inverter IV1 generates a second select signal SEL_N by inverting the enable signal EN, and applies the second select signal SEL_N to a gate of the high voltage PMOS transistor HVP11.

When the enable signal EN is applied as a logic high level and the second select signal SEL_N is applied as a logic low level (0V), the high voltage NMOS transistor HVN1 is turned on in response to the precharge signal PRE such that the enable signal EN is transmitted to the output node Q. Thus, the potential level of the output node Q is increased. The depletion transistor DHVN11 is turned on in response to the potential of the output node Q, and the high voltage PMOS transistor HVP11 is turned on in response to the second select signal SEL_N. Thus, the potential of the output node Q is increased by the input voltage Vin.

The discharge circuit 143 discharges the potential of the output node Q to a ground voltage Vss in response to the enable signal EN. The discharge circuit 143 includes an inverter IV2 and a transistor HVN2. The inverter IV2 inverts the enable signal EN and applies the inverted signal to a gate of the transistor HVN2. The transistor HVN2 is coupled between the output node Q and a ground voltage Vss, and discharges the potential of the output node Q as the ground voltage Vss in response to the signal inverted by the inverter IV2.

Figure 4:
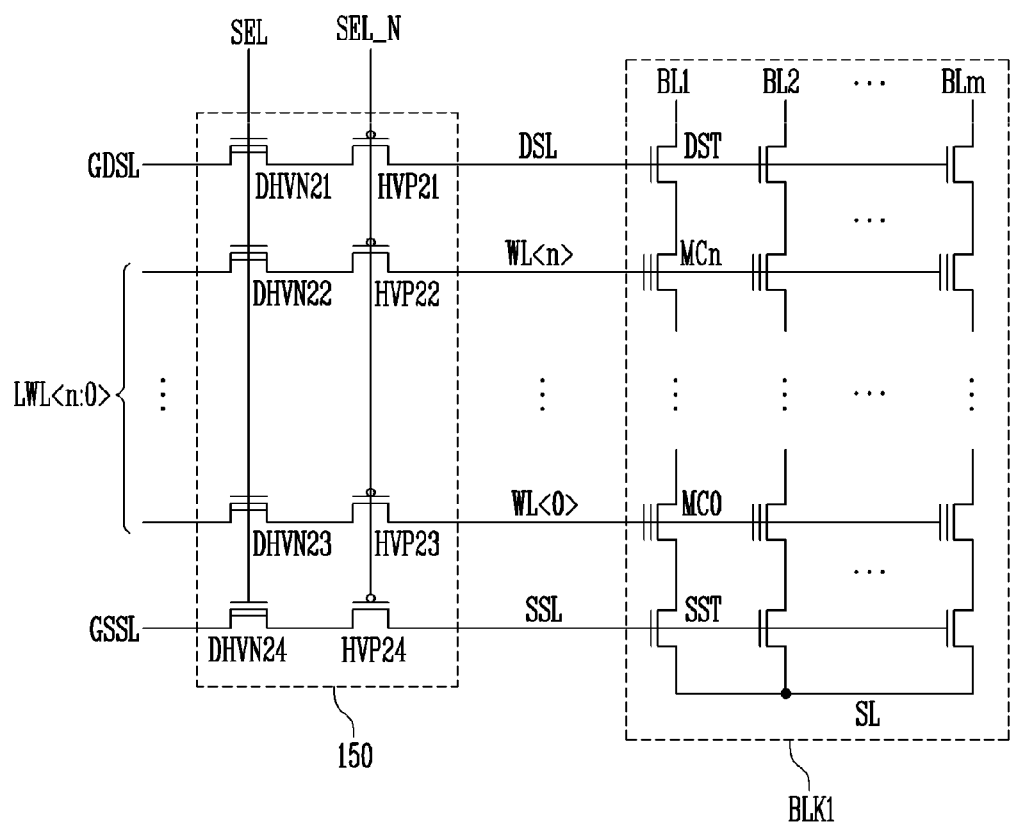
FIG. 4 is a representation of an example of circuit diagram illustrating a pass circuit and a memory block of FIG. 2.

FIG. 4 is a representation of an example of a circuit diagram illustrating the pass circuit and the memory block of FIG. 2.

Referring to FIG. 4, the pass circuit 150 couples the local word lines LWL<n:0> and the word lines WL (i.e., WL<n> to WL<0>) to each other in response to the select signal pair output from the block switch 140 of FIG. 3. The pass circuit 150 couples a global drain select line GDSL and a global source select line GSSL to the respective drain and source select lines DSL and SSL of the memory block BLK1 in response to the select signal pair SEL and SEL_N.

The pass circuit 150 may be designed in a structure in which the switching circuit 12 of FIG. 1 is provided in plurality.

The pass circuit 150 includes a plurality of depletion transistors DHVN21 to DHVN24 and a plurality of high voltage PMOS transistors HVP21 to HVP24. One of the plurality of depletion transistors DHVN21 to DHVN24 and one of the plurality of high voltage PMOS transistors HVP21 to HVP24 are coupled in series to each other. For example, the depletion transistor DHVN21 and the high voltage PMOS transistor HVP21 are coupled in series between the global drain select line GDSL and the drain select line DSL, and the depletion transistor DHVN22 and the high voltage PMOS transistor HVP22 are coupled in series between a local word line LWL<n> and a word line WL<n>.

The plurality of depletion transistors DHVN21 to DHVN24 are turned on in response to the first select signal SEL output from the block switch 140, and the plurality of high voltage PMOS transistors HVP21 to HVP24 are turned on in response to the second select signal SEL_N output from the block switch 140.

The memory block BLK1 includes a plurality of memory cells MC<n:0>. Also, the memory block BLK1 includes drain select transistors DST coupled to the drain select line DSL and source select transistors SST coupled to the source select line SSL. The plurality of source select transistors may share a source line SL with one another.

An example of an operating method of the semiconductor memory device according to an embodiment of the present disclosure will be described with reference to FIGS. 2 to 4.

1) When Operation Voltage is Applied to Selected Memory Block

The decoder circuit 141 of the block switch 140 outputs an enable signal EN of a high level in response to the plurality of decoded address signals ADDR (XA, XB, XC, and XD).

The high voltage transistor HVN1 is turned on in response to the precharge signal PRE, and transmits the enable signal EN to the node Q. Thus, the potential level of the node Q is increased by the potential level of the enable signal EN.

The depletion transistor DHVN11 is turned on in response to the potential of the node Q, and the high voltage PMOS transistor HVP11 is turned on in response to a second selection signal SEL_N, so that the potential of the node Q is increased by the input voltage Vin that is the same voltage as an operation voltage generated by the voltage provider 130.

Thus, the block switch 140 outputs a first select signal SEL having the same potential level as the operation voltage generated by the voltage provider 130 and a second select signal SEL_N of a logic low level.

The plurality of depletion transistors DHVN21 to DHVN24 of the pass circuit 150 are turned on in response to the first select signal SEL having the same potential level as the operation voltage generated by the voltage provider 130. Also, the plurality of high voltage PMOS transistors HVP21 to HVP24 are turned on in response to the second select signal SEL_N of the logic low level. Thus, the pass circuit 150 can transmit the operation voltage generated by the voltage provider 130 to the word lines WL without any potential drop.

2) When Operation Voltage Applied to Unselected Memory Block is Blocked

The decoder circuit 141 of the block switch 140 outputs an enable signal of a low level in response to the plurality of decoded address signals ADDR (XA, XB, XC, and XD).

The high voltage transistor HVN1 is turned on in response to the precharge signal PRE, but the node Q maintains 0V according to the enable signal EN of the logic low level. The high voltage PMOS transistor HVP11 is turned off in response to the second select signal SEL_N of a high level to block the input voltage Vin from being applied to the node Q.

Thus, the block switch 140 outputs a first select signal SEL of a logic low level and a second select signal SEL_N of a logic high level.

The plurality of depletion transistors DHVN21 to DHVN24 of the pass circuit 150 are not completely turned off in response to the first select signal SEL of the logic low level. However, the plurality of high voltage PMOS transistors HVP21 to HVP24 are turned off in response to the second select signal SEL_N of the logic high level. Thus, the pass circuit 150 blocks the operation voltage generated by the voltage generating unit 130 from being applied to the word lines WL.

According to the embodiment of the present disclosure, the semiconductor memory device can transmit an operation voltage to the memory cell array without any potential drop. Thus, a pump circuit for generating a control signal having a higher potential level than the operation voltage is unnecessary to transmit the operation voltage generated by the voltage provider to the memory cell array. Accordingly, it is possible to improve the degree of integration of the semiconductor memory device and improve current consumption.

Figure 5:
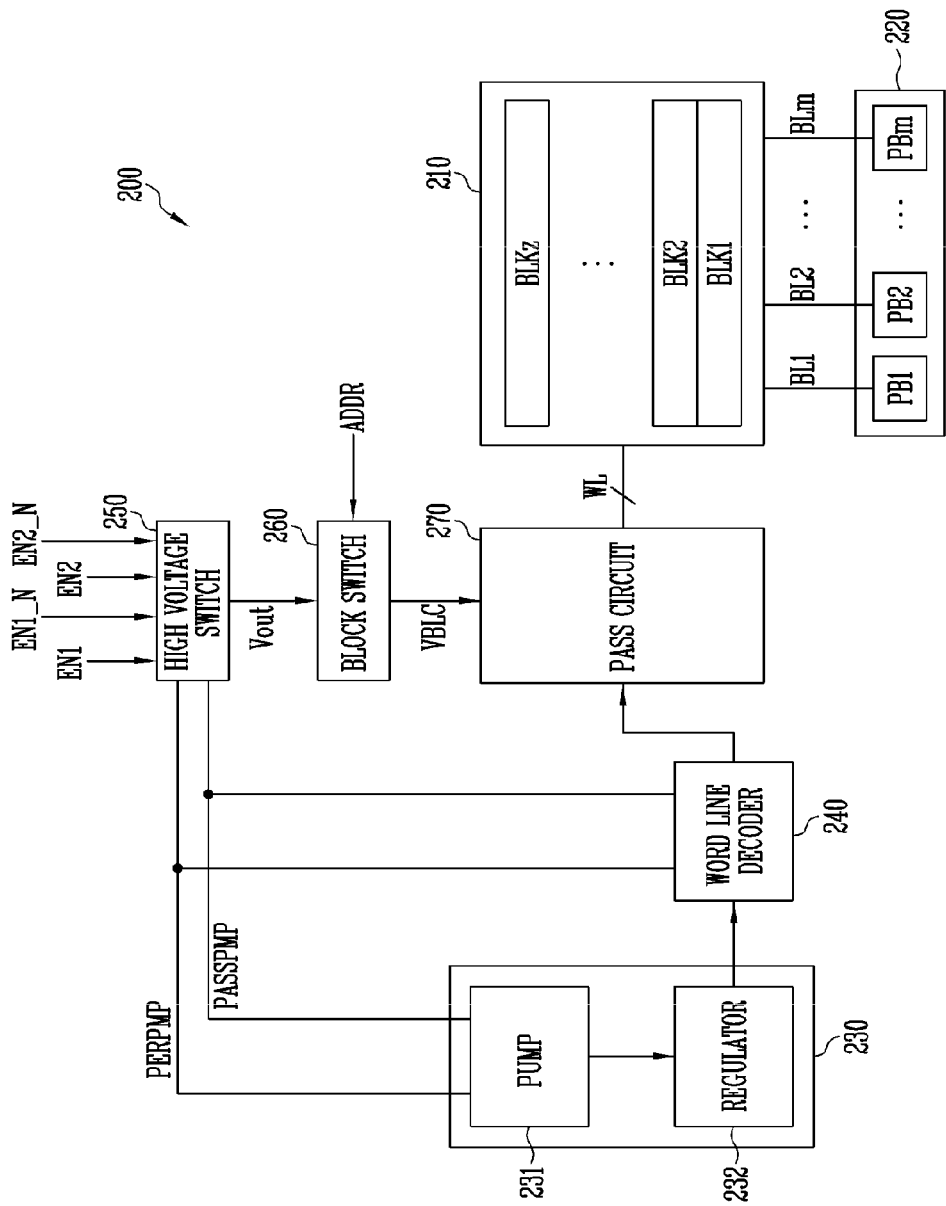
FIG. 5 is a block diagram illustrating a representation of an example of a semiconductor memory device according to an embodiment of the present disclosure.

FIG. 5 is a block diagram illustrating a representation of an example of a semiconductor memory device according to an embodiment of the present disclosure.

Referring to FIG. 5, the semiconductor memory device 200 includes a memory cell array 210, a read/write circuit 220, a voltage provider 230, a word line decoder 240, a high voltage switch 250, a block switch 260, and a pass circuit 270.

The memory cell array 210 includes a plurality of memory blocks BLK1 to BLKz. The plurality of memory blocks BLK1 to BLKz are coupled to the pass circuit 270 through word lines WL. The plurality of memory blocks BLK1 to BLKz are coupled to the read/write circuit 220 through bit lines BL1 to BLm. The bit lines BL1 to BLm may be divided into an even bit line group and an odd bit line group. The memory cell array 210 may be configured and operated identically to the memory cell array 110 of FIG. 2.

The read/write circuit 220 includes a plurality of page buffers PB1 to PBm. The plurality of page buffers PB1 to PBm are coupled to the memory cell array 210 through the bit lines BL1 to BLm. In a program operation, the plurality of page buffers PB1 to PBm temporarily store program data and then control potential levels of the bit lines BL1 to BLm according to the temporarily stored data. In a read operation, the plurality of page buffers PB1 to PBm read data stored in the memory cells by sensing potential levels or currents of the bit lines BL1 to BLm.

The voltage provider 230 includes a pump 231 and a regulator 232. In the program operation, the pump 231 generates a program pump voltage PERPMP and a pass pump voltage PASSPMP and transmits the generated voltages to the high voltage switch 250 and the word line decoder 240. In the program operation, the regulator 232 generates a program voltage, a pass voltage, etc. by regulating a plurality of pump voltages generated by the pump 231, and transmits the program voltage, the pass voltage, etc. to the word line decoder 240.

The word line decoder 240 receives operation voltages, such as a program voltage and a pass voltage, applied through the regulator 232, and decodes the operation voltages and then transmits the decoded operation voltages to the pass circuit 270 according to the program pump voltage PERPMP and the pass pump voltage PASSPMP.

The high voltage switch 250 generates an output voltage Vout by using the program pump voltage PERPMP and the pass pump voltage PASSPMP, transmitted from the pump 231, in response to first enable signals EN1 and EN1_N and second enable signals EN2 and EN2_N. When the output voltage Vout is generated by using the program pump voltage PERPMP and the pass pump voltage PASSPMP, the high voltage switch 250 outputs the output voltage Vout such that the potential level of the output voltage Vout is equal to the potential level of the program pump voltage PERPMP or the potential level of the pass pump voltage PASSPMP. That is, the high voltage switch 250 generates the output voltage Vout by performing switching without any potential drop of the program pump voltage PERPMP and the pass pump voltage PASSPMP.

The first enable signals EN1 and EN1_N and the second enable signals EN2 and EN2_N may be signals generated by a control logic (not illustrated) for controlling an operation of selectively applying a program voltage or a pass voltage in overall operations of the semiconductor memory device. For example, the control logic may activate and output the first enable signals EN1 and EN1_N in an operation of applying the program voltage to the memory cell array 210, and activate and output the second enable signals EN2 and EN2_N in an operation of applying the pass voltage to the memory cell array 210.

The block switch 260 outputs a block select signal VBLC by using the output voltage Vout in response to an address signal ADDR.

The pass circuit 270 is coupled to the word lines WL of the memory cell array 210, and applies, to the word lines WL, operation voltages applied through the word line decoder 240 in response to the block select signal VBLC.

Figure 6:
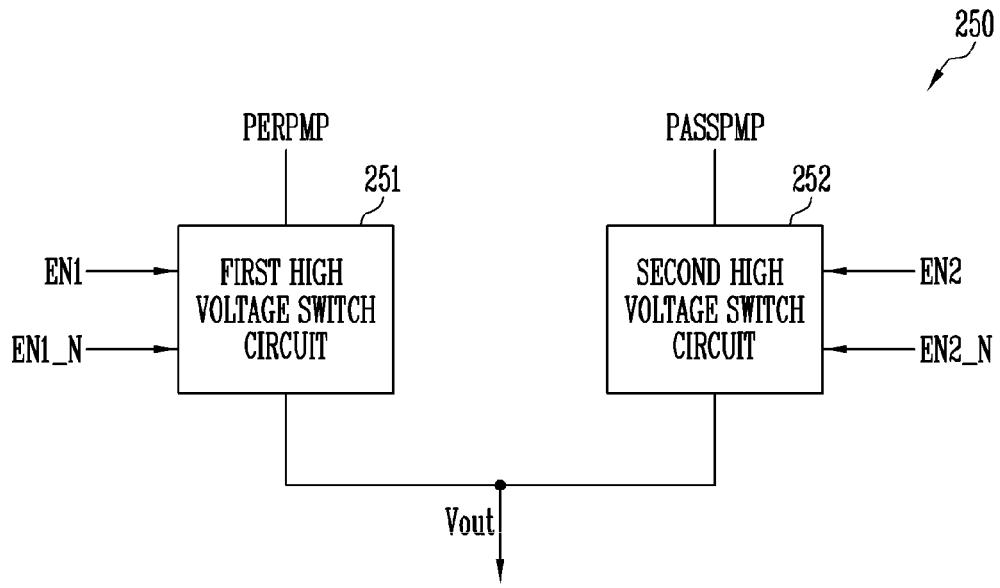
FIG. 6 is a representation of an example of a block diagram of a high voltage switch of FIG. 5.

FIG. 6 is a representation of an example of block diagram of the high voltage switch of FIG. 5.

Referring to FIG. 6, the high voltage switch 250 includes a first high voltage switch circuit 251 and a second high voltage switch circuit 252.

The first high voltage switch circuit 251 switches the program pump voltage PERPMP to the output voltage Vout and outputs the switched output voltage Vout in response to the first enable signals EN1 and EN1_N. The second high voltage switch circuit 252 switches the pass pump voltage PASSPMP to the output voltage Vout and outputs the switched output voltage Vout in response to the second enable signals EN2 and EN2_N.

In a switching operation, the first high voltage switch circuit 251 and the second high voltage switch circuit 252 output the output voltage by performing switching on the program pump voltage PERPMP and the pass pump voltage PASSPMP without any potential drop.

Figure 7:
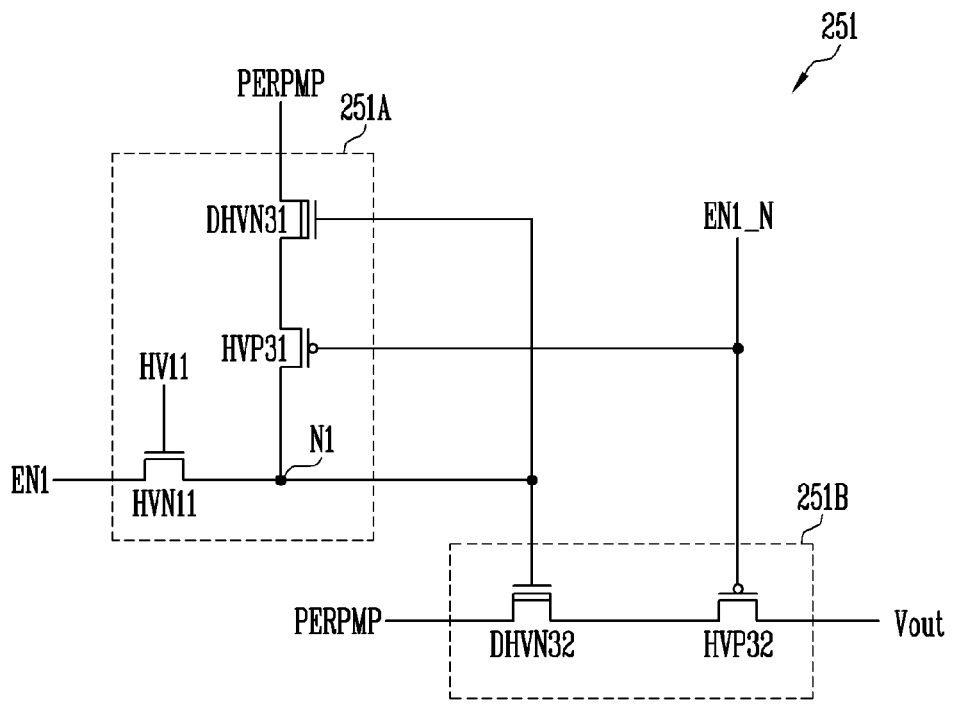
FIG. 7 is a representation of an example of a circuit diagram of a first high voltage switch circuit of FIG. 6.

FIG. 7 is a representation of an example of circuit diagram of the first high voltage switch circuit of FIG. 6.

The first high voltage switch circuit 251 and the second high voltage switch circuit 252 may be similarly configured except that voltages input to the first high voltage switch circuit 251 and the second high voltage switch circuit 252 are the program pump voltage PERPMP and the pass pump voltage PASSPMP, respectively.

The first high voltage switch circuit 251 may be configured identically to the high voltage switch circuit of FIG. 1.

Referring to FIG. 7, the first high voltage switch circuit 251 includes a control signal generator 251A and a switching circuit 251B.

The control signal generator 251A includes a high voltage NMOS transistor HVN11, a depletion transistor DHVN31, and a high voltage PMOS transistor HVP31.

The high voltage NMOS transistor HVN11 is turned on in response to a high voltage signal HV11, and transmits a first enable signal EN1 to a node N1. The high voltage signal HV11 may be an internal signal having 3 to 5V.

The depletion transistor DHVN31 and the high voltage PMOS transistor HVP31 is coupled in series between the node N1 and a terminal to which a program pump voltage PERPMP is applied. A gate of the depletion transistor DHVN31 is coupled to the node N1. A first enable signal EN1_N in a reverse relationship with the first enable signal EN is applied to a gate of the high voltage PMOS transistor HVP31.

The switching circuit 251B includes a depletion transistor DHVN32 and a high voltage PMOS transistor HVP32. The depletion transistor DHVN32 and the high voltage PMOS transistor HVP32 are coupled in series between an output terminal Vout and a terminal to which a program pump voltage PERPMP to be transmitted is applied. A gate of the depletion transistor DHVN32 is coupled to the node N1 of the control signal generator 251A. The first enable signal EN1_N is applied to a gate of the high voltage PMOS transistor HVP32.

When the first enable signal EN1 is applied as a logic high level and the first enable signal EN1_N is applied as a logic low level (0V), the high voltage NMOS transistor HVN11 is turned on in response to the high voltage signal HV11 such that the first enable signal EN1 is transmitted to the node N1. Thus, the potential level of the node N1 is increased. The depletion transistor DHVN31 is turned on in response to the potential of the node N1 to supply the program pump voltage PERPMP to a node between the depletion transistor DHVN31 and the high voltage PMOS transistor HVP31. The high voltage PMOS transistor HVP31 is turned on in response to the first enable signal EN1_N of the logic low level. Thus, the program pump voltage PERPMP is supplied to the node N1, so that the potential level of the node N1 is increased by the potential level of the program pump voltage PERPMP. In this state, the depletion transistor DHVN11 has a negative threshold voltage, and thus the program pump voltage PERPMP can be transmitted without any potential drop when the program pump voltage PERPMP is supplied to the node N1.

When the potential level of the node N1 is increased up to the level of the program pump voltage PERPMP, the depletion transistor DHVN32 has a negative threshold voltage, and thus any potential drop is not generated when the program pump voltage PERPMP is transmitted to a node between the depletion transistor DHVN32 and the high voltage PMOS transistor HVP32. The high voltage PMOS transistor HVP32 outputs the program pump voltage PERPMP as an output voltage Vout in response to the first enable signal EN1_N.

On the contrary, when the switching operation is blocked, the first enable signal EN1 is applied as a logic low level (0V) and the first enable signal EN1_N is applied as a logic high level. In this case, the high voltage signal HV is applied as 3 to 5V.

The high voltage NMOS transistor HVN11 is turned on in response to a high voltage signal HVN11. Thus, the first enable signal EN1 is transmitted to the node N1, so that the potential level of the node N1 becomes the logic low level (0V).

The depletion transistor DHVN31 is not completely turned off in response to the potential of the node N1. However, the high voltage PMOS transistor HVP31 is turned off in response to the first enable signal EN1_N of the logic high level. Thus, the potential level of the node N1 maintains 0V.

The depletion transistor DHVN32 of the switching circuit 2518 is not completely turned off in response to the potential level (0V) of the node N1. However, the high voltage PMOS transistor HVP32 is turned off in response to the first enable signal EN1_N to block the program pump voltage PERPMP from being output as the output voltage Vout.

According to an embodiment of the present disclosure, the high voltage switch can transmit an input voltage without any potential drop in an operation of transmitting a high voltage. Also, a local pump circuit for switching high voltages having different potential levels is unnecessary in an operation of transmitting the high voltages. Accordingly, it is possible to improve the degree of integration of the semiconductor memory device and improve current consumption.

Figure 8:
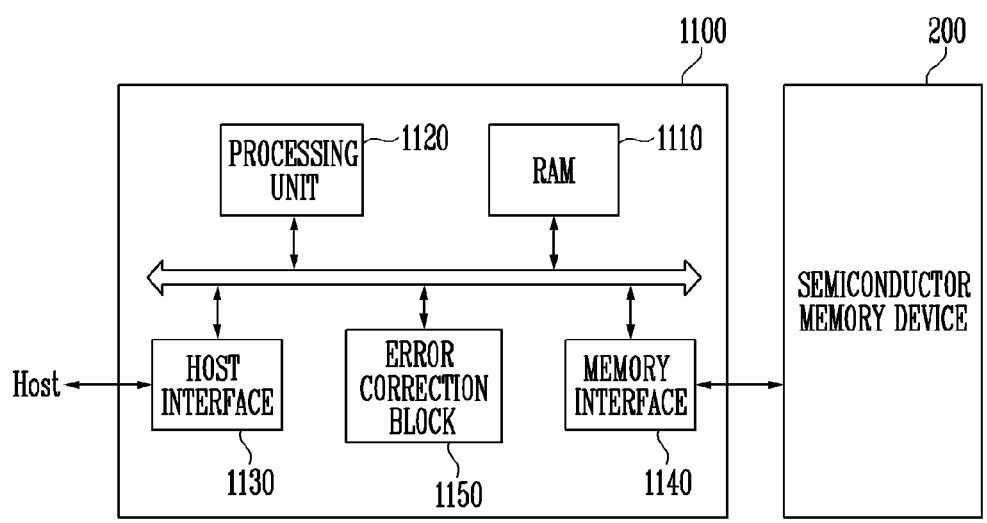
FIG. 8 is a block diagram illustrating a representation of an example of a memory system including the semiconductor memory device of FIG. 5.

FIG. 8 is a block diagram illustrating a representation of an example of a memory system including the semiconductor memory device of FIG. 5.

Referring to FIG. 8, the memory system 1000 includes a semiconductor memory device 200 and a controller 1100. The semiconductor memory device may be configured and operated identically to that described with reference to FIG. 5. Also, the semiconductor memory device 200 may be replaced by the semiconductor memory device 100 of FIG. 2.

The controller 1100 is connected to a host Host and the semiconductor memory device 200. The controller 1100 is configured to access the semiconductor memory device 200 in response to a request from the host Host. For example, the controller 1100 is configured to control read, write, erase, and background operations of the semiconductor memory device 200. The controller 1100 is configured to provide an interface between the semiconductor memory device 200 and the host Host. The controller 1100 is configured to drive firmware for controlling the semiconductor memory device 200.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 200 and the host Host, and a buffer memory between the semiconductor memory device 200 and the host Host. The processing unit 1120 controls overall operations of the controller 1100. The controller 1100 may temporarily store program data provided from the host Host when a write operation is performed.

The host interface 1130 includes a protocol for exchanging data between the host Host and the controller 1100. As an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 200. For example, the memory interface 1140 may include a NAND interface or a NOR interface.

The error correction block 1150 is configured to detect and correct an error of data received from the semiconductor memory device 200 by using an error correction code (ECC). The processing unit 1120 may control the semiconductor memory device 200 to adjust a read voltage based on an error detection result of the error correction block 1150 and perform a re-read operation.

The controller 1100 and the semiconductor memory device 200 may be integrated into one semiconductor device. As an embodiment, the controller 1100 and the semiconductor memory device 200 may be integrated into one semiconductor device, to constitute a memory card. For example, the controller 1100 and the semiconductor memory device 200 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 200 may be integrated into one semiconductor device to constitute a semiconductor drive (solid state drive (SSD)).

The semiconductor drive SSD includes a storage device configured to store data in a semiconductor memory. If the memory system 1000 is used as the semiconductor drive SSD, the operating speed of the host Host connected to the memory system 1000 can be remarkably improved.

As an example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

As an embodiment, the semiconductor memory device 200 or the memory system 1000 may be packaged in various forms. For example, the semiconductor memory device 200 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 9:
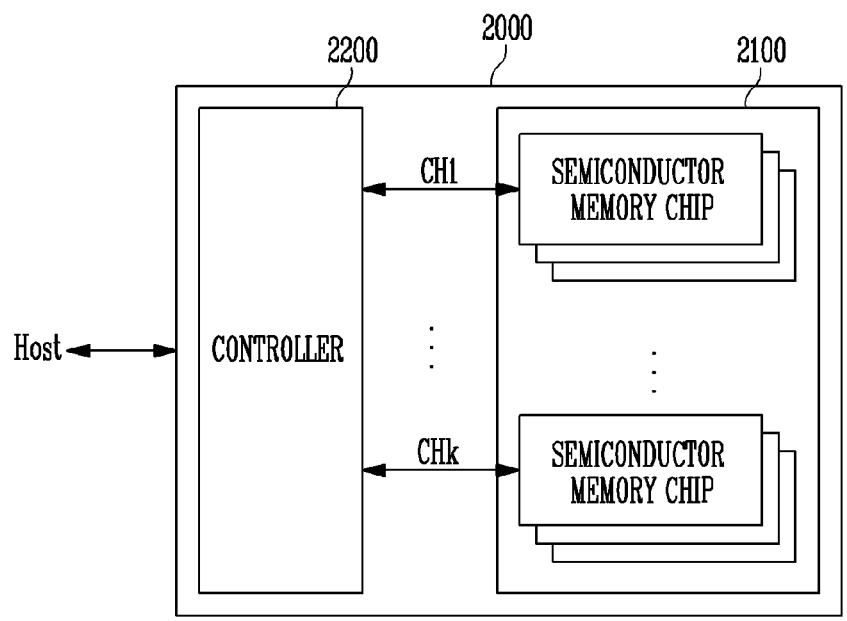
FIG. 9 is a block diagram illustrating a representation of an example of an application example of the memory system of FIG. 8.

FIG. 9 is a block diagram illustrating a representation of an example of an application example of the memory system of FIG. 8.

Referring to FIG. 9, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 9, it is illustrated that the plurality of groups communicate with the controller 2200 through first to kth channels CH1 to CHk. Each semiconductor memory chip may be configured and operated identically to one of the semiconductor memory devices 200 described with reference to FIG. 5 or the semiconductor memory device 100 described with reference to FIG. 2.

Each group is configured to communicate with the controller 2200 through one common channel. The controller 2200 is configured similarly to the controller 1100 described with reference to FIG. 8. The controller 2200 is configured to control the plurality of memory chips of the semiconductor memory device 2100 through the plurality of channels CH1 to CHk.

Figure 10:
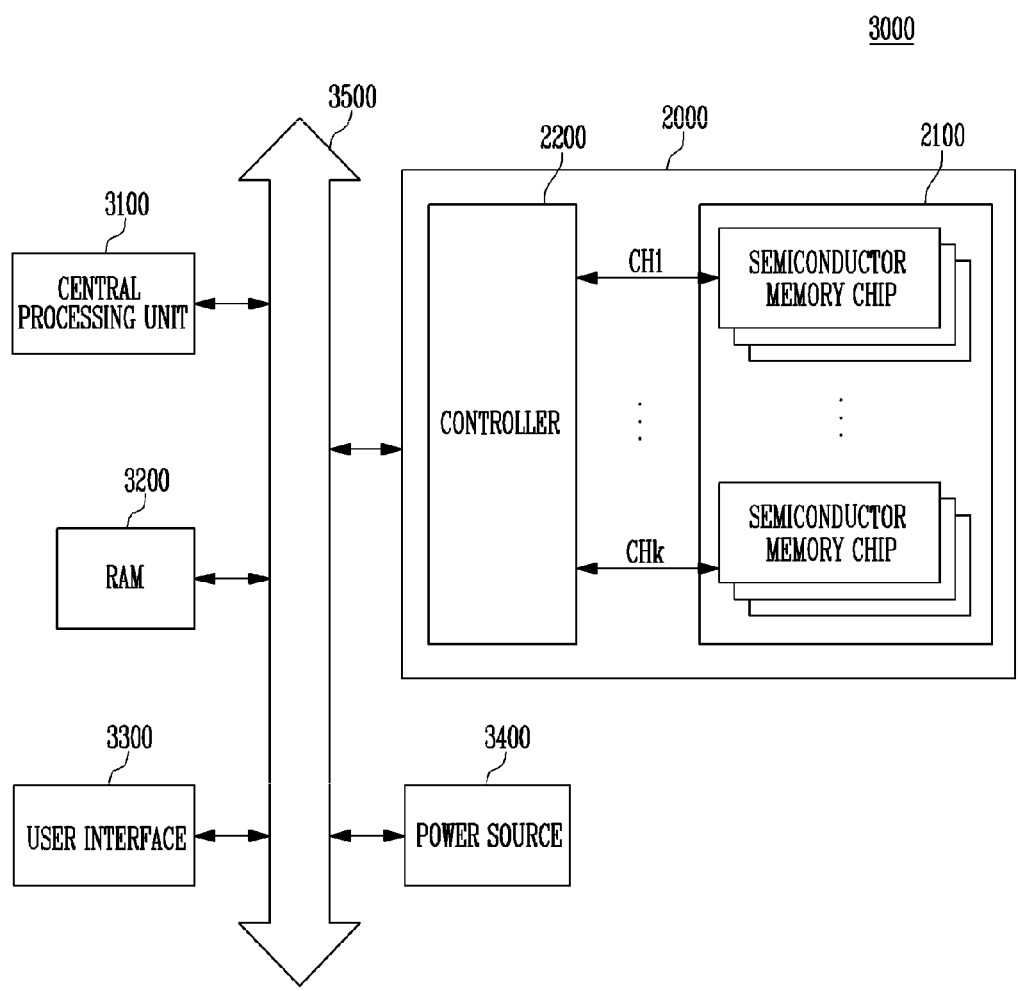
FIG. 10 is a block diagram illustrating a representation of an example of a computing system including the memory system described with reference to FIG. 9.

FIG. 10 is a block diagram illustrating a representation of an example of a computing system including the memory system described with reference to FIG. 9.

Referring to FIG. 10, the computing system 3000 includes a central processing unit 3100, a random access memory (RAM) 3200, a user interface 3300, a power source 3400, a system bus 3500, and a memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

Referring to FIG. 10, it is illustrated that the semiconductor memory device 2100 is connected to the system bus 3500 through the controller 2200. However, the semiconductor memory device 2100 may be directly connected to the system bus 3500. In this case, the function of the controller 2200 may be performed by the central processing unit 3100 and the RAM 3200.

Referring to FIG. 10, it is illustrated that the memory system 2000 described with reference to FIG. 9 is provided. However, the memory system 2000 may be replaced by the memory system 1000 described with reference to FIG. 8. As an embodiment, the computing system 3000 may be configured to include both the memory systems 1000 and 2000 described with reference to FIGS. 8 and 9.

According to the present disclosure, a high voltage is switched without any potential drop, so that a local pump circuit for generating a switching signal having a higher potential level than a high voltage to be transmitted is unnecessary. Thus, it is possible to reduce the area of the local pump circuit and reduce current consumption.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array configured to include a plurality of memory cells;
a voltage provider configured to generate a plurality of pump voltages and a plurality of operation voltages;
a high voltage switch configured to output an output voltage by switching the plurality of pumping voltages;
a block switch configured to output a block select signal by using the output voltage in response to an address signal; and
a pass circuit configured to transmit the plurality of operation voltages to the memory cell array in response to the block select signal,
wherein the high voltage switch outputs the output voltage with the same potential level as the plurality of pump voltages,
wherein the high voltage switch includes:
a first high voltage switch circuit configured to switch a program pump voltage among the plurality of pump voltages and output the switched program pump voltage as the output voltage; and
a second high voltage switch circuit configured to switch a pass pump voltage among the plurality of pump voltages and output the switched pass pump voltage as the output voltage.

2. The semiconductor memory device of claim 1, wherein each of the first and second high voltage switch circuits includes:
- a switching circuit configured to include a first depletion transistor and a first high voltage transistor, which are coupled in series between an input terminal and an output terminal; and
- a control signal generator configured to apply, to the first depletion transistor, a control signal having the same potential level as an input voltage input to the input terminal, in response to an enable signal.

3. The semiconductor memory device of claim 2, wherein the first high voltage transistor is a high voltage PMOS transistor.

4. The semiconductor memory device of claim 2, wherein the control signal generator includes:
- a second depletion transistor and a second high voltage transistor, which are coupled in series between the input terminal and a node; and
- a third high voltage transistor configured to transmit the first enable signal to the node in response to a high voltage signal.

5. The semiconductor memory device of claim 4, wherein the second high voltage transistor is a high voltage PMOS transistor.

6. The semiconductor memory device of claim 2, wherein the switching circuit transmits, to the output terminal, the input voltage input to the input terminal without any potential drop.

* * * * *